(12) United States Patent
Schmidt et al.

(10) Patent No.: US 8,035,287 B2
(45) Date of Patent: Oct. 11, 2011

(54) FLUORESCENT LIGHTING CREATING WHITE LIGHT

(75) Inventors: Peter Schmidt, Aachen (DE);
Hans-Helmut Bechtel, Roetgen (DE);
Wolfgang Busselt, Roetgen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 286 days.

(21) Appl. No.: 12/298,061

(22) PCT Filed: Apr. 10, 2007

(86) PCT No.: PCT/IB2007/051271
§ 371 (c)(1),
(2), (4) Date: Oct. 22, 2008

(87) PCT Pub. No.: WO2007/122531
PCT Pub. Date: Nov. 1, 2007

(65) Prior Publication Data
US 2009/0072710 A1    Mar. 19, 2009

(30) Foreign Application Priority Data
Apr. 25, 2006 (EP) .................... 06113086

(51) Int. Cl.
*H01J 1/62* (2006.01)
*H01J 63/04* (2006.01)
(52) U.S. Cl. .............. 313/487; 313/498; 313/503
(58) Field of Classification Search ........ 313/498–512; 257/98–100
See application file for complete search history.

(56) References Cited

U.S. PATENT DOCUMENTS

| | | |
|---|---|---|
| 3,611,069 A | 10/1971 | Galginaitis et al. |
| 6,939,481 B2 | 9/2005 | Srivastava et al. |
| 2004/0145308 A1 | 7/2004 | Rossner et al. |
| 2004/0183085 A1 | 9/2004 | Okazaki |
| 2004/0256974 A1 | 12/2004 | Mueller-Mach et al. |
| 2005/0001230 A1 | 1/2005 | Takekuma |
| 2005/0184638 A1 | 8/2005 | Mueller et al. |
| 2005/0236971 A1 | 10/2005 | Mueller-Mach et al. |
| 2006/0022582 A1 | 2/2006 | Radkov |

FOREIGN PATENT DOCUMENTS

JP    2002299691 A   * 10/2002

OTHER PUBLICATIONS

Tanabe Setsuhisa et al: "YAG glass-ceramic phosphor for white LED (II): Luminescence characteristics" Proc SPIE Int Soc Opt Eng; Proceedings of SPIE—The International Society for Optical Engineering; Fifth International Conference on Solid State Lighting 2005, vol. 5941, 2005, pp. 1-6, XP002459950.

Sakuma K et al: "Warm-white light-emitting diode with yellowish orange SiAlON ceramic phosphor" Optics Letters, OSA, Optical Society of America, Washington, DC, US, vol. 29, No. 17, Sep. 1, 2004, pp. 2001-2003, XP002368762 ISSN: 0146-9592.

* cited by examiner

*Primary Examiner* — Joseph L Williams
*Assistant Examiner* — Kevin Quarterman

(57) ABSTRACT

A light emitting system (1) comprising a radiation source (2) capable of emitting a first light of at least a first wavelength spectrum; a first fluorescent material (4) capable of absorbing at least partially the first light and emitting second light having a second wavelength spectrum; a second fluorescent material (8) capable of absorbing at least partially the first light and emitting a third light having a third wavelength spectrum; wherein one, the first (4) or the second fluorescent material (8) is a polycrystalline ceramic with a density of more than 97 percent of the density of a monocrystalline material and the respective other fluorescent material is a phosphor powder with a median particle size 100 nm<$d_{50\%}$<50 μm.

20 Claims, 6 Drawing Sheets

FLUORESCENT LIGHTING CREATING WHITE LIGHT

The present patent application relates generally to phosphor-converted semiconductor light emitting devices.

Semiconductor light-emitting devices including light emitting diodes (LEDs) are among the most efficient light sources currently available. LEDs in use are capable of operating in the whole visible spectrum. The LEDs may be produced using semiconductors, including the Group of III-V semiconductors, particularly binary, ternary, and quaternary alloys of gallium, aluminum, indium, and nitrogen, also referred to as ITT-nitride materials.

LEDs are commonly used in various different illumination systems, for example, for lighting, atmosphere lighting, advertisement lighting, etc. In order to provide a good lighting impression, illumination systems using UV-LEDs have been proposed, where the light emitted from the UV-LED is converted by means of a fluorescent material.

Since blue-UV light has higher photon energy, i.e. a shorter wavelength, relative to other colors of visible light, such light can be readily converted to produce light having a longer wavelength. It is well known in the art that light having a first peak wavelength ("first light") can be converted into light having a longer peak wavelength ("second/third light") using a process known as luminescence. The fluorescence process involves absorbing the first light by a photoluminescent material (also called phosphors), which excites the atoms of the material, and emits the second light. The peak wavelength and the band of wavelengths around it, may be called wavelength, in short. The wavelength of the second light will depend on the photoluminescent material. The type of photoluminescent material can be chosen to yield secondary light having a particular peak wavelength.

To improve a color-rendering index (CRI) of lighting systems using LEDs, a dichromatic illumination system has already been proposed. In such a system, the primary emission of a blue LED is combined with light emitted by a photoluminescent material, for example a yellow phosphor. For example, a $Y_3Al_5O_{12}:Ce^{3+}$ phosphor is used as a photoluminescent material. A portion of the blue light emitted from the LED is converted to yellow light by the phosphor. Another portion of the blue light from the LED is transmitted through the phosphor. Thus, this system emits both blue light emitted from the LED, and yellow light emitted from the phosphor. The mixture of blue and yellow emission bands are perceived as white light by an observer. The perceived light has a CRI between 70 and 80 and a color temperature that ranges from about 5000 K to about 8000 K.

Nevertheless, in many lighting applications, the CRI of less than 80 is not acceptable. For example, in business lighting, in atmosphere lighting, etc, white light LEDs based on the dichromatic approach can often not be used, because the CRI is poor, caused by the absence of red color components. In particular, for color temperatures below 5000 K as used in general illumination, the CRI is below 70 with the dichromatic blue-yellow LED lighting system.

In order to further improve the CRI even at high correlated color temperatures (CCT), i.e. CCT<6000, a wavelength converted semiconductor light emitting device has been proposed, where a first wavelength converting material and a second wavelength converting material is provided. CCT of a light source may be understood according to the color coordinates of a Planckian Emitter with said temperature with minimum distance to the color point of the light source in CIE u-v system from 1960.

The first wavelength converting material (fluorescent material) emits light having a shorter wavelength than light emitted by the second wavelength converting material. The first and second wavelength converting materials may be deposited on the light emitting device. However, within the known devices, the efficacy is poor because the first and second wavelength converting materials are intermixed resulting in strong back-scattering and loss of light. Further, the second wavelength converting material is often only excited by the light emitted from the first wavelength converting material. Further, the adjustment of the desired correlated color temperature (CCT) is very poor.

Therefore, it is an object of the present application to provide a lighting system emitting white light with a high CRI. It is another object of the application to provide a lighting system, which has a high efficacy, a well-defined color temperature and good lighting properties. It is another object of the present application to provide LED lighting with a warm white light emission, i.e. CCT<6000 K. Another object of the application is to allow adjusting the CCT of a lighting system.

These and other objects are solved by a light emitting system comprising a radiation source capable of emitting a first light of at least a first wavelength spectrum, a first fluorescent material capable of absorbing at least partially the first light and emitting second light having a second wavelength spectrum, a second fluorescent material capable of absorbing at least partially the first light and emitting a third light having a third wavelength spectrum, wherein the first or the second fluorescent material is a polycrystalline ceramics with a density of more than 97 percent of the density of a monocrystalline material and wherein the respective other fluorescent material is a phosphor powder with a median particle size 100 nm<$d_{50\%}$<50 µm.

The second fluorescent material may be a polycrystalline ceramics with a density of more than 97 percent of the density of a monocrystalline material with an identical composition.

A monocrystalline material may be understood as a crystalline solid phase in which the crystal lattice of the entire sample is continuous, non-distorted and unbroken to the edges of the sample, with no grain boundaries. Its density is 100%.

Polycrystals may be made up of a number of smaller crystals known as crystallites. The density of the polycrystals may be defined by the number of pores, glass phases or extrinsic phases. The term "polycrystalline material" may be understood as a material with a volume density larger than 90 percent of the main constituent, consisting of more than 80 percent of single crystal domains, with each domain being larger than 0.5 µm in diameter and having different crystallographic orientations. The single crystal domains may be connected by amorphous or glassy material or by additional crystalline constituents.

The phosphor powder may comprise monocrystals and polycrystals. It has been found that the combination of a polycrystalline ceramics with a density of more than 97 percent of the density of a monocrystalline material with identical composition with a phosphor powder provides high mechanic stability and at the same time a good CRI.

The high density material may be understood as a ceramic. It may have ≧95% to ≦100% of the theoretical density. Thus, the ceramic provides greatly improved mechanical and optical characteristics compared to materials with less density. Preferably, the ceramic material has ≧97% to ≦100% of the theoretical density, more preferred ≧98% to ≦100%

The radiation source may be a LED emitting light with a short wavelength, preferably in the UVA to blue spectral region, for example between about 330 nm and about 470 nm. Other radiation sources emitting high energy light are also possible. The fluorescent materials completely or partially absorb the light from the radiation source and emit it again in other spectral regions in a sufficiently broad band, and by use of the second fluorescent material with a significant proportion of red. An overall emission with the desired white color temperature and CRI is formed.

The first fluorescent material, which converts the wavelength of the first light, may be a cerium doped polycrystalline ceramic body. The ceramic may, for example, be a cerium doped YAG:Ce (0.5%) garnet. The first fluorescent material may emit light in the yellow-green spectrum. The first fluorescent material may be excited by the first light. For example, a green-yellow emitting cerium-praseodymium-activated lutetium-yttrium-aluminum-gallium-scandium garnet phosphor of general formula $(Lu_{1-x-y}Y_xGd_y)_{3-a-b}(Al_{1-m-n}Ga_m Sc_n)_5O_{12}:Ce_aPr_b)$ with $0 \leq x \leq 1$, $0 \leq y \leq 0.5$, $0.001 \leq a \leq 0.02$, $0.001 \leq b \leq 0.005$, $0 \leq m \leq 0.5$, and $0 \leq n \leq 0.5$ may be used. For example, the garnet material may have preferred compositions of $(Lu_{0.2}Y_{0.8})_{2.994}(Al_{4.95}Sc_{0.05})_5O_{12}:Ce_{0.006}$ or $(Y_{0.9}Gd_{0.1})_{2.994}Al_5O_{12}:Ce_{0.006}$. The examples may also include compositions that deviate from the ideal garnet stoichiometry, for example, $(Y_{0.9}Gd_{0.1})_{2.994}Al_{5.01}O_{12.015}:Ce_{0.006}$. Most preferably, compositions that show a deviation from ideal stoichiometry are single phase. The examples may also include compositions with additional components that can be traced back to the use of sintering fluxes like borates, silicon oxides, silicates, alkaline earth compounds, fluorides, or nitrides like aluminum nitride or silicon nitride. These additional components may be dissolved in the ceramic garnet grains or may be present as secondary phases like grain boundary phases.

The second fluorescent material may be, for example, a red-emitting phosphor, such as a red emitting europium-activated phosphor. The second fluorescent material may be selected from the group of $(Ca_{1-x-y}Sr_x)S:Eu_y$, with $0 \leq x \leq 1$, $0.0003 \leq y \leq 0.01$; $(Ba_{1-x-y}Sr_xCa_y)_{2-z}Si_{5-a}Al_aN_{8-a}O_a:Eu_z$ with $0 \leq x \leq 0.5$, $0 \leq y \leq 0.8$, $0.0025 \leq z \leq 0.05$, $0 \leq a \leq 1$; or $(Ca_{1-x-y}Sr_xMg_y)_{1-z}Si_{1-a}Al_{1+a}N_{3-a}O_a:Eu_z$ with $0 \leq x \leq 0.5$, $0 \leq y \leq 0.2$, $0.003 \leq z \leq 0.05$, $0 \leq a \leq 0.02$. Preferably, a europium activated calcium aluminum silicon nitride of composition $Ca_{0.98}Si_{0.985}Al_{1.015}N_{2.99}O_{0.01}:Eu_{0.02}$ is used, which is a high chromaticity red phosphor excitable from the near UV (400 nm) to the blue-green (500 nm) with high quantum efficiency. For an optimized use of this phosphor for fluorescent conversion of primary LED light, it is necessary to modify the photophysical characteristics to achieve, for example, efficacy, color specifications and lifetime of related light emitting devices. The chromaticity and quantum efficiency of the europium activated calcium aluminum silicon nitride can be modified through the substitution of divalent metal ions for calcium from the list including Ba, Sr, Mg, by changing the N/O and Al/Si ratio in the lattice. Most preferably, the red emitting europium activated calcium aluminum silicon nitride material is produced by cofiring with a halide flux added such as ammonium chloride or sodium chloride. The halide flux lowers the required firing temperature of the phosphor and greatly improves the light output of the material. Most of the residual flux may be washed out after firing, however, small amounts may be incorporated in the lattice without deteriorating the luminescence properties leading to formulations such as $Ca_{0.98}Si_{0.985}Al_{1.015}N_{2.99}O_{0.01}:Eu_{0.02}Cl_x$, $x \leq 0.0015$ or $Ca_{0.96}Na_{0.02}SiAlN_{2.98}O_{0.02}:Eu_{0.02}Cl_x$, $x \leq 0.0015$.

According to embodiments, the second fluorescent material may be separated from the first fluorescent material in at least one extra layer. The extra layer may be positioned either between the radiation source emitting a first wavelength spectrum and the first fluorescent material emitting a second wavelength spectrum, or on top of the first fluorescent material emitting a second wavelength spectrum. The second fluorescent material may also be arranged within at least one recess, preferably more than two recesses, on the surface of the a fluorescent material. The recess may be arranged within a first surface either of the first fluorescent material in front of the radiation source or the second fluorescent material in front of the radiation source. This may result in that the third light having the third wavelength spectrum is excited predominantly by the first light. The recesses may be pits, grooves, dents, cavities, indentation or the like. The recess may be arranged on a surface, which is opposite to the surface facing the radiation source. The recesses may be arranged in compartments.

The first fluorescent material may have at least one flat surface with the second fluorescent material forming a second fluorescent layer on said flat surface. Preferably, the second fluorescent layer is scattering light. The second fluorescent material, which converts the wavelength of the first and the second light, may be arranged within the recess. The second fluorescent material may be deposited on the surface of the first fluorescent material or arranged within the recess as balls, accumulations, clusters, beadings, cubes, and the like.

By arranging the second fluorescent material in a separate layer or in the recess, the second light emitted from the first fluorescent material is only minimally absorbed. The light from the first fluorescent material is emitted with minimized re-absorption by the second fluorescent material. In addition, the second fluorescent material is arranged close to the radiation source, such that already the first light excites the second fluorescent material and light emitted from the first fluorescent material is not transmitted through the second fluorescent material.

The quality in rendering illuminated colors of a white light emitting radiation source, which is indicated as the color rendering index (CRI), should be improved by a lighting system according to embodiments. A CRI of 100 is an indication that the light emitted from the light source is identical to that from a black body source, i.e. an incandescent or halogen lamp for CCT<5000 K in the visible spectral range from 380-780 nm or identical to a 'sun-like' spectrum as defined by CIE Pub 13.3 (CIE 13.3: 1995, Method of Measuring and Specifying Colour Rendering Properties of Light Sources).

By arranging the layer thickness, the size and dimension of the recess, the CCT and CRI may be adjusted. For example, the distance between the at least two recesses may be chosen to be 0.1-1 mm, preferably 0.5 mm. The recesses may be formed in the surface of the first fluorescent material comb-shaped. The depth of each recess may be at least half the thickness of the first fluorescent material. It is preferred that the recess has a depth of 20 μm. The thickness D of the at least one polycrystalline fluorescent material is 50μ<D<850 μm, preferably 80μ<D<250 μm. The comb-shaped recesses can be formed by pyramids on the surface of the first fluorescent material. The peaks of the pyramids may be cut-off.

According to embodiments, the second fluorescent material may be arranged at least one surface of the first fluorescent material such that the composition of the first light, the second light and the third light has a color rendering index higher than 80 at a correlated color temperature of less than 6000 K, preferably less than 5000 K.

For example the layer formed by the second fluorescent material formed on at least one surface of the first fluorescent material has a scattering coefficient s in the range of 30 $cm^{-1}<s<1000\ cm^{-1}$. Such a layer may consist of a phosphor particles with a median diameter $d_{50\%}$ of 0.5 $\mu m<d_{50\%}<20$ $\mu m$. In another example, the depth of the at least one recess may be at least half the thickness of the first fluorescent material, preferably 20 $\mu m$. By that, the second fluorescent material is arranged close to the radiation source and the light from the first fluorescent material may radiate without interference by the second fluorescent material. For enabling direct excitation of the second fluorescent material by the LED light source, embodiments provide the at least one recess with an opening angle of between 15° and 160°, preferably 90°.

Another aspect of the application is a lighting device comprising a previously described light emitting system.

A further aspect of the application is a method for manufacturing a light emitting system with forming recesses within a surface of a first fluorescent material, depositing a second fluorescent material into the formed recesses, and mounting the first fluorescent material onto a radiation source. In particular for creating a previously described lighting system.

Another aspect of the application is a method for manufacturing a light emitting system with a first fluorescent material, forming a foil with a binder material with a second fluorescent material and depositing the foil with the second fluorescent material onto the radiation source with said first fluorescent material. In particular for creating a previously described lighting system. Foils may be made by dispersing a powder phosphor ($d_{50\%}$=5 $\mu m$) of 1 to 20 percent by weight into a highly visco-elastic polymer gel as a binding carrier material. Examples for binding materials include thermoplastics, thermoset plastics, resins, binders, base polymers, monomers, composite materials, and silicone compounds. Solvent additives may be used to adjust viscosity and hardening properties required for foil production. Foils can be formed through processes such as molding, casting, extrusion, pultrusion, machining, thermal forming and plastic welding. Foils may be formed in the required sized prior to deposition onto the second fluorescent material.

These and other aspect of the application will become apparent from and elucidated with reference to the following figures.

Figure 1:
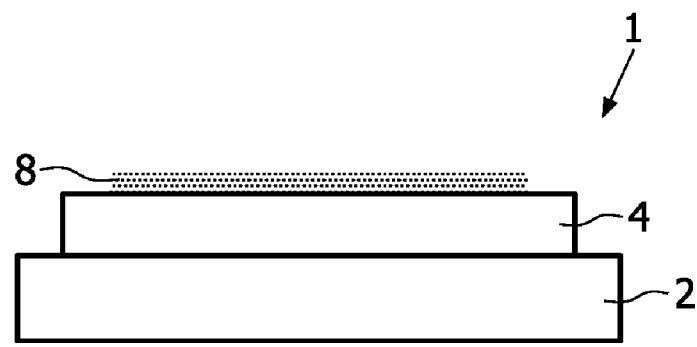
FIG. 1 illustrates a side view of a first embodiment of a lighting system.

FIG. 1 illustrates a side view onto a lighting system 1 according to embodiments. The system 1 may comprise a radiation source 2, which may be, for example, a blue light emitting LED. Arranged on the surface of the LED 2 is a first fluorescent material 4. The first fluorescent material 4 has a flat surface on which a second fluorescent material 8 is deposited. The first fluorescent 4 material is preferably a polycrystalline ceramics with a density of more than 97 percent of the density of a monocrystalline material. The second fluorescent material 8 is preferably a powder. The powder may have a median particle $d_{50}\%$ size between 100 nm$<d_{50\%}<$50 $\mu m$. The powder may be applied onto the surface of the first fluorescent material by dusting, electrostatic dusting or so-called photo-tacky processes. It may also be possible to a apply the second fluorescent 8 material as a foil composed of a binder material with phosphor and to deposit the foil with the second fluorescent material onto the radiation source with said first fluorescent material.

Figure 2:
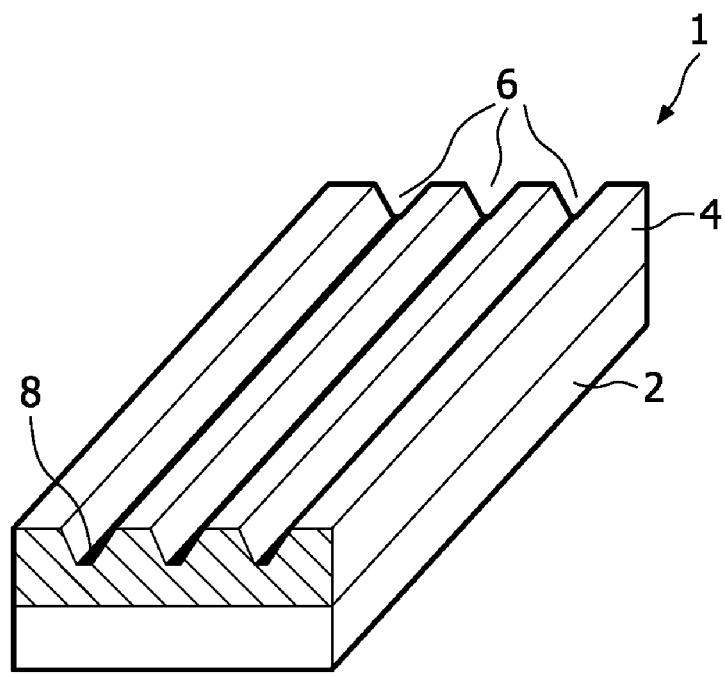
FIG. 2 illustrates a perspective view of a second embodiment of a lighting system.

FIG. 2 illustrates a perspective view onto a lighting system 1 according to embodiments. The system 1 may comprise a radiation source, which may be, for example, an UV-LED 2. Arranged on the surface of the LED 2 is a first fluorescent material 4. The first fluorescent material 4 has recesses 6, in which a second fluorescent material 8 is deposited.

The used fluorescent material 4, 8 may be responsive to ultraviolet light as is created by fluorescent lamps and light emitting diodes, visible light as in blue-emitting diodes. The radiation source needs to emit light having a wavelength capable of exciting the fluorescent materials 4, 8. These may be discharge lamps and blue- and UV-emitting semiconductor light emitting devices such as light emitting diodes and laser diodes.

Radiation sources include semiconductor optical radiation emitters and other devices that emit optical radiation in response to electrical excitation. Semiconductor optical radiation emitters include light emitting diode LED chips, light emitting polymers (LEPs), organic light emitting devices (OLEDs), polymer light emitting devices (PLEDs), etc.

Moreover, light emitting components such as those found in discharge lamps and fluorescent lamps, such as mercury low and high pressure discharge lamps, sulfur discharge lamps, and discharge lamps based an molecular radiators are also contemplated for use as radiation sources. Particularly good results are achieved with a blue LED 2 whose emission maximum lies at 400 to 480 nm. Optimal ranges have been found to lie at 440 to 460 nm and 438 to 456 nm, taking particular account of the excitation spectrum of the fluorescent materials 4, 8 used.

The first fluorescent material 4 may be a green/yellow-emitting garnet. For example, $Ce^{3+}$ (preferably 0.15%) doped $Y_3Al_5O_{12}$ is useful for applications requiring white light. The narrow excitation spectrum of conventional $Y_3Al_5O_{12}$:$Ce^{3+}$ leads to a gap in the combined spectrum between the emission of the LED 2 and the emission of the first fluorescent material 4. Widening the excitation spectrum permits the use of a LED 2 emitting light of a wavelength that can at least partially fill the spectrum gap, which potentially has a favorable effect on the color rendering of the composite light emitted by the device. Though in the above discussion of the first embodiment the garnet host $Y_3Al_5O_{12}$ is specifically mentioned, it is to be understood that garnet fluorescent materials having the general formula $(Lu_{1-x-y}Y_xGd_y)_{3-a-b}(Al_{1-m-n}Ga_mSc_n)_5O_{12}$:$Ce_aPr_b$) with $0 \leq x \leq 1$, $0 \leq y \leq 0.5$, $0.001 \leq a \leq 0.02$, $0.001 \leq b \leq 0.005$, $0 \leq m \leq 0.5$, and $0 \leq n \leq 0.5$ may also be used. This class of fluorescent material is based on activated luminescence of cubic garnet crystals. Garnets are a class of materials with the crystal chemical formula $A_3B_5X_{12}$. A atoms may be chosen from the group comprising Y, Gd, Lu, Tb, Yb, La, Ca, Sr, B atoms may be chosen from the group comprising Al, Mg, Sc, B, Ga, Si, Ge, In, and X atoms may be chosen from the group comprising O, N, F, S. Part of the A atoms may be substituted by the doping atoms chosen from the group comprising Ce, Pr, Sm, Eu, Dy, Ho, Er, Tm. The doping concentration may be in the range 0.01-10 mole % with respect to the A atoms, most preferably in the range 0.1-2 mole %.

The second fluorescent material 8 may be a red-emitting phosphor. Examples of suitable red-emitting phosphors include $Ca_{1-x-y}Sr_xAlSiN_3:Eu_y$, or $Sr_{2-x}Si_5N_8:Eu_x$, wherein $0.005 \leq x \leq 0.05$, or $Sr_{2-y}Si_{5-x}Al_xN_{8-x}O_x:Eu_y$, wherein $0 \leq x \leq 2$, $0.005 \leq y \leq 0.05$, or $Ba_{2-x-y}Sr_xSi_5N_8:Eu_y$, wherein $0 \leq x \leq 1$, $0.005 \leq y \leq 0.05$.

The light emitted from LED 2 is converted in its wavelength by both the first fluorescent material 4 and the second fluorescent material 8. Blue light emitted by the LED 2 mixes with green and red light emitted by first fluorescent material 4 and the second fluorescent material 8 to make white light. The CCT and CRI of the white light may be controlled by controlling the design of the first fluorescent material 4 and the second fluorescent material 8.

The patterns of fluorescent material 4, 8 may be formed by providing recesses in a layer of the first fluorescent material 4, i.e. using mechanical grinding and sawing techniques, conventional lithography and etching techniques, depositing the second fluorescent material 8, i.e. by electrophoretic deposition. Alternatively, patterns and layers of fluorescent material may be deposited by screen printing or ink jet printing or dusting, electrostatic dusting or so-called photo-tacky processes. Eventually, the package of first fluorescent material 4 and second fluorescent material 8 may be placed onto the LED 2.

According to embodiments, the second fluorescent material 8 is deposited in recesses 6 of the first fluorescent material 4. The recesses 6 can be formed as pits, grooves, dents, cavities, indentation. As illustrated in FIG. 1, the recesses are arranged in grooves, which are parallel to each other along the length of the first fluorescent material.

Figure 3:
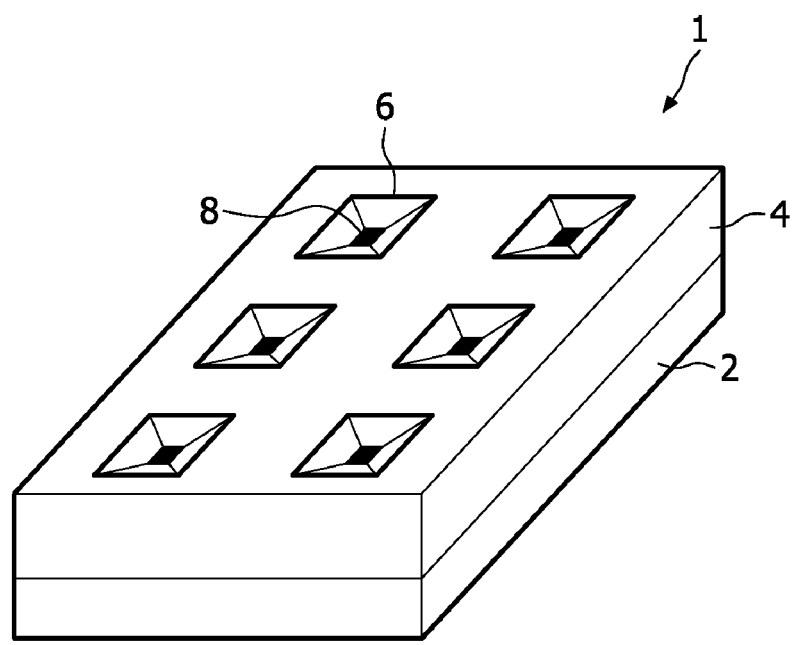
FIG. 3 illustrates a perspective view of a third embodiment of a lighting system.

Another arrangement according to embodiments is illustrated in FIG. 3. As can be seen, the recesses 6 are arranged as indentations, which are distributed evenly across the surface of the first fluorescent material 4. The recesses 6 have a bottom, within which a blind hole can be arranged. The blind hole on the bottom of the recesses 6 can be used to deposit the second fluorescent material 8.

Figure 4:
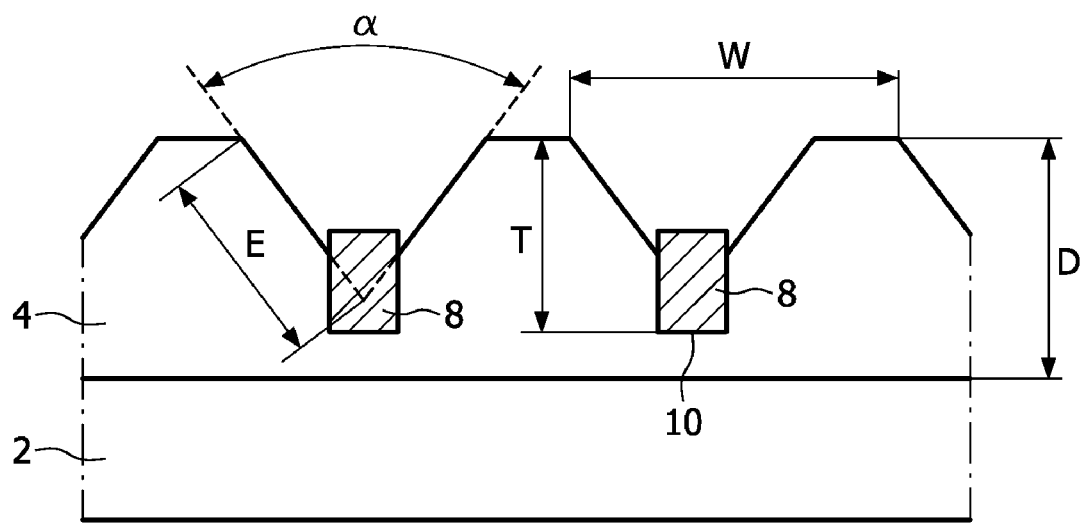
FIG. 4 illustrates a sectional view of embodiments of a lighting system.

A sectional view of the recesses 6 is illustrated in FIG. 4. The second fluorescent material 8 is deposited within a blind hole 10 of the recess 6. The blind hole 10 is arranged on the bottom surface of the recess 6. The angle α is between 45° and 170°, preferably 90°. The size E is preferably 170 μm. The depth of the recess 6 and the blind hole 10 is preferably 180 μm. The overall thickness D is preferably 350 μm. The distance between two recesses 6 is preferably 0.5 mm.

By arranging the size and dimension of the recess, the CCT may be adjusted. For example, the distance between the at least two recesses may be chosen to be 0.1-1 mm, preferably 0.5 mm. The recesses may be formed in the surface of the first fluorescent material comb-shaped. The depth of each recess may be 180 μm and the thickness of the first fluorescent material may be 350 μm. The comb-shaped recess can be formed by pyramids on the surface of the first fluorescent material. The peaks of the pyramids may be cut-off.

According to embodiments, the second fluorescent material may be arranged within the at least one recess of the surface of the first fluorescent material such that the composition of the first light, the second light and the third light has a color rendering index higher than 80 at a correlated color temperature of less than 6000 K, preferably less than 5000 K.

For example, the depth of the at least one recess may be at least half the thickness of the first fluorescent material. By that, the second fluorescent material is arranged close to the radiation source. The third light may radiate in the direction of light without interference by the first fluorescent material. In addition, the second light may radiate in the direction of light without interference by the second fluorescent material.

For enabling free radiation of third light into the direction of light, embodiments provide the at least one recess with an opening angle of between 45° and 120°, preferably 90°. The illustrated arrangement of the second fluorescent material 8 in the recess 6, enables absorbing only a minimal amount of light emitted from the first fluorescent material 4. In addition, the second fluorescent material is arranged close to the LED 2, such that already the light from the LED 2 excites the second fluorescent material 8. The pyramidal formed opening in the first fluorescent material 4 allow the light emitted from the second fluorescent material to emit without distortion into the direction of light. As can be seen from FIG. 4, the recess may be comb-shaped. Each of the recess may have a pyramidal shape. The peaks of the pyramids may be cut-off providing an even surface on the first fluorescent material 4.

Figure 5:
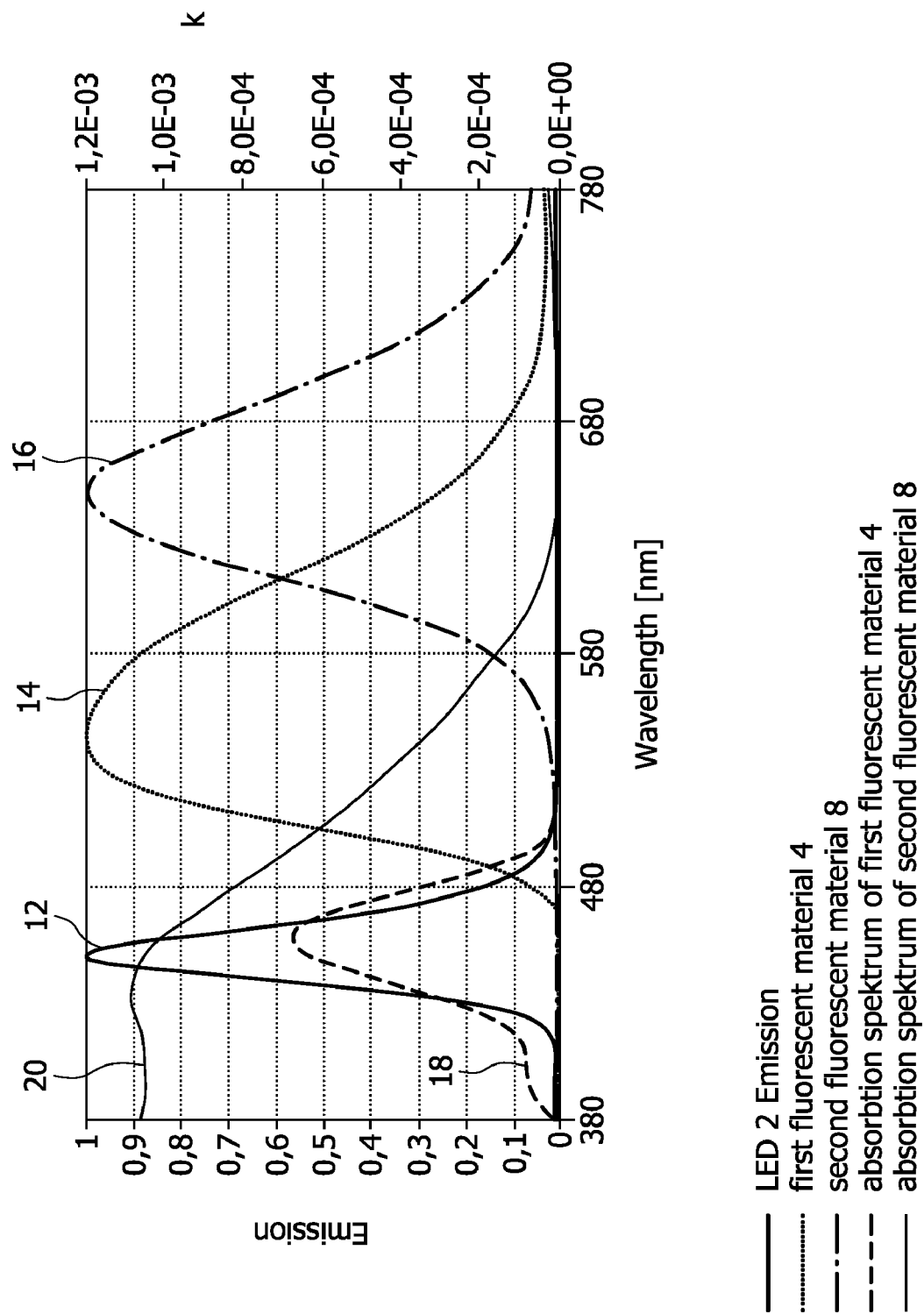
FIG. 5 illustrates emission and absorption spectra of the components of a lighting system according to embodiments.
Figure 6:
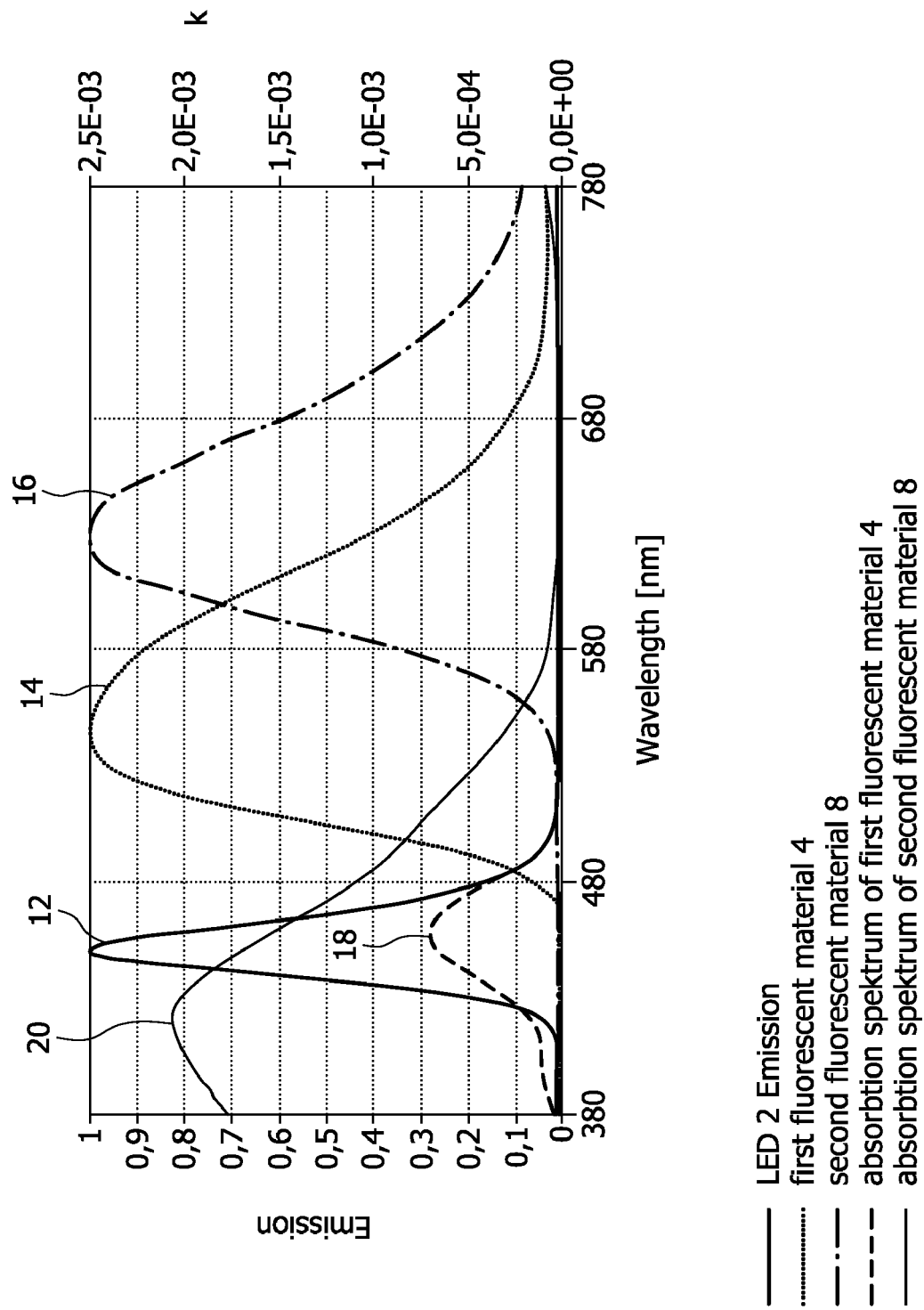
FIG. 6 illustrates another emission and absorption spectra of the components of a lighting system according to embodiments.
Figure 7:
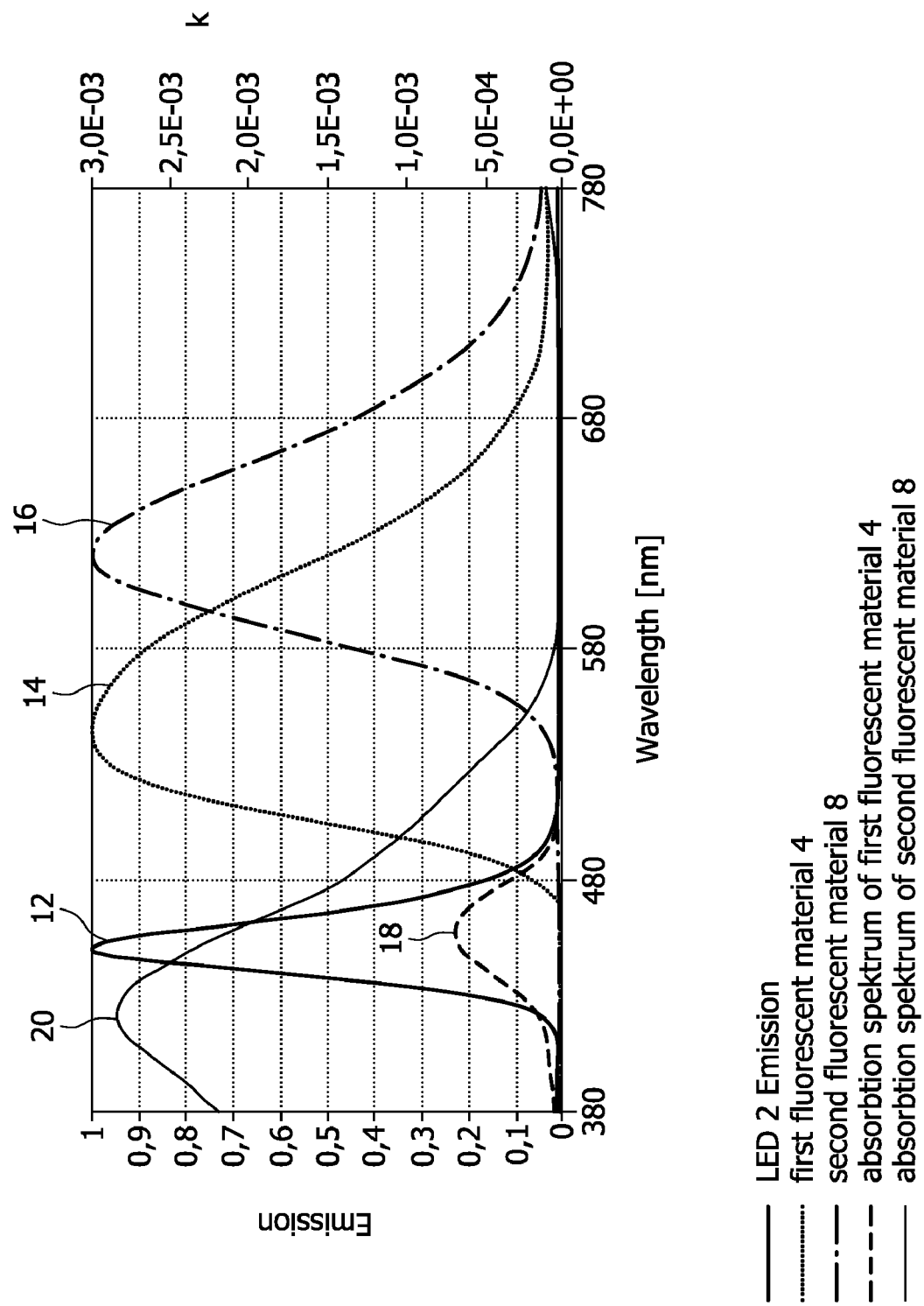
FIG. 7 illustrates another emission and absorption spectra of the components of a lighting system according to embodiments.

FIGS. 5-7 illustrate emission and absorption spectra. Illustrated are normalized emission spectra of LED 2 (12), of first fluorescent material 4 (14), and second fluorescent material 8 (16). In addition, absorption spectra (k) of first fluorescent material 4 (18) and of second fluorescent material 8 (20) are illustrated.

FIG. 5 illustrates an emission spectrum 16 of a second fluorescent material 8 $Ca_{1-x}Sr_xAlSiN_3:Eu$, wherein $0<x<1$ and emission spectrum 14 from a YAG:Ce (0.3%) garnet as first fluorescent material 4. The respective absorption spectrum 20 of second fluorescent material 8 $Ca_{1-x}Sr_xAlSiN_3:Eu$, wherein $0<x<1$ and absorption spectrum 18 from a YAG:Ce (0.3%) garnet as first fluorescent material 4 are shown.

FIG. 6 illustrates an emission spectrum 16 of a second fluorescent material 8 $Sr_{2-y}Si_{5-x}Al_xN_{8-x}Ox:Eu_y$, wherein $0<x<2$, $0.005<y<0.05$, and emission spectrum 14 from a YAG:Ce (0.2%) garnet as first fluorescent material 4. The respective absorption spectrum 20 of second fluorescent material 8 $Sr_{2-y}Si_{5-x}Al_xN_{8-x}Ox:Eu_y$, wherein $0<x<2$, $0.005<y<0.05$, and absorption spectrum 18 from a YAG:Ce (0.2%) garnet as first fluorescent material 4 are shown.

FIG. 7 illustrates an emission spectrum 16 of a second fluorescent material 8 $Sr_{2-x}Si_5N_8:Eu_x$, wherein $0.005<x<0.05$, and emission spectrum 14 from a YAG:Ce (0.5%) garnet as first fluorescent material 4. The respective absorption spectrum 20 of second fluorescent material 8 $Sr_{2-x}Si_5N_8:Eu_x$, wherein $0.005<x<0.05$, and absorption spectrum 18 from a YAG:Ce (0.5%) garnet as first fluorescent material 4 are shown.

Figure 8:
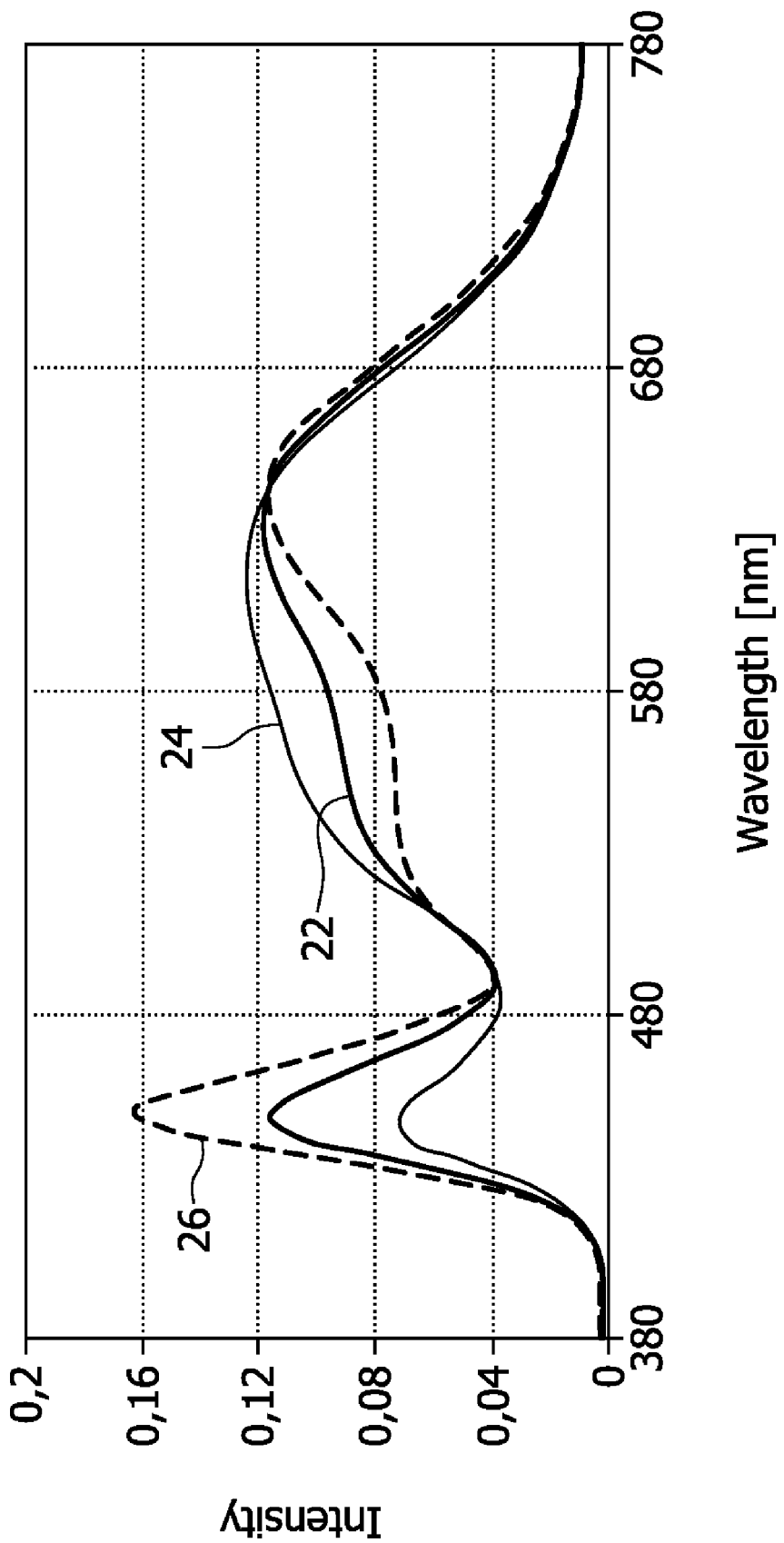
FIG. 8 illustrates emission spectra for different arrangements of lighting system according to embodiments.

FIG. 8 illustrates emission spectra of lighting system 1 according to embodiments. Graph 22 illustrates an emission spectrum of a lighting system as illustrated in FIG. 2. Graph 26 illustrates an emission spectrum of a lighting system as illustrated in FIG. 1. Eventually, Graph 24 illustrates an emission spectrum of a lighting system wherein the second fluorescent material 8 is sandwiched between the LED 2 and the first fluorescent material 4.

The inventive arrangement of recesses and depositions provides the creation of white light with a CRI of above 80 at a color temperature of less than 6000K, preferably less than 5000K.

The invention claimed is:
1. A light emitting system (1) comprising:
a radiation source (2) capable of emitting a first light of at least a first wavelength spectrum;

a first fluorescent material (4) capable of absorbing at least partially the first light and emitting a second light having a second wavelength spectrum;

a second fluorescent material (8) capable of absorbing at least partially the first light and emitting a third light having a third wavelength spectrum;

wherein one of the first (4) or the second fluorescent material (8) is a polycrystalline ceramic and the respective other fluorescent material is a phosphor powder.

2. The light emitting system (1) of claim 1, wherein at least a portion of the second fluorescent material (8) is arranged between the radiation source (2) and the first fluorescent material.

3. The light emitting system (1) of claim 1, wherein the second fluorescent material (8) is arranged within at least one recess (6) of a surface of the first fluorescent material (4).

4. The light emitting system (1) of claim 3 wherein at least a portion of the second fluorescent material is disposed between the radiation source and first fluorescent material (4).

5. The light emitting system (1) of claim 3, wherein the depth of the at least one recess (6) is at least half a thickness of the first fluorescent material (4).

6. The light emitting system (1) of claim 3, wherein a thickness D of the at least one polycrystalline fluorescent material is 50 µm<D<850 µm.

7. The light emitting system (1) of claim 1, wherein the second fluorescent material (8) is arranged with the first fluorescent material (4) such that the composition of the first light, the second light and the third light has a color rendering index higher than 80 at a correlated color temperature CCT of less than 6000 K.

8. The light emitting system (1) of claim 3, wherein the second fluorescent material (8) is arranged within the least one recess (6) of the surface of the first fluorescent material (4) such that excitation of the third light by the second light is less than excitation by the first light.

9. The light emitting system (1) of claim 3, wherein the at least one recess (6) has an opening angle of between 15° and 160°.

10. The light emitting system (1) of claim 3, wherein the distance between the at least two recesses (6) is 0.1-1 mm.

11. The light emitting system (1) of claim 1, wherein said first fluorescent material (4) comprises a phosphor having the formula $(Lu_{1-x-y}Y_xGd_y)_{3-a-b}(Al_{1-m-n}Ga_mSc_n)_5O_{12}:Ce_aPr_b)$ with $0 \leq x \leq 1$, $0 \leq y \leq 0.5$, $0.001 \leq a \leq 0.02$, $0.001 \leq b \leq 0.005$, $0 \leq m \leq 0.5$, and $0 \leq n \leq 0.5$.

12. The light emitting system (1) of claim 1, wherein the second fluorescent material (8) may be selected from the group of consisting of $(Ca_{1-x-y}Sr_x)S:Eu_y$ with $0 \leq x \leq 1$, $0.0003 \leq y \leq 0.01$; $(Ba_{1-x-y}Sr_xCa_y)_{2-z}Si_{5-a}Al_aN_{8-a}O_a:Eu_z$ with $0 \leq x \leq 0.5$, $0 \leq y \leq 0.8$, $0.0025 \leq z \leq 0.05$, $0 \leq a \leq 1$; and $(Ca_{1-x-y}Sr_xMg_y)_{1-z}Si_{1-a}Al_{1+a}N_{3-a}O_a:Eu_z$ with $0 \leq x \leq 0.5$, $0 \leq y \leq 0.2$, $0.003 \leq z \leq 0.05$, $0 \leq a \leq 0.02$.

13. A lighting device comprising a light emitting system (1) of claim 1.

14. The light emitting system (1) of claim 1, wherein at least a portion of the first fluorescent material (8) is arranged between the radiation source (2) and the second fluorescent material.

15. The light emitting system (1) of claim 3 wherein the at least a portion of the first fluorescent material is disposed between the radiation source and second fluorescent material.

16. The light emitting system (1) of claim 1 wherein the polycrystalline ceramic has a density of more than 97 percent of the density of a monocrystalline material.

17. The light emitting system (1) of claim 1 wherein the phosphor powder has a median particle size 100 nm<$d_{50\%}$<50 µm.

18. A method for manufacturing a light emitting system (1) comprising:
  forming recesses (6) within a surface of a first fluorescent material (4);
  placing a second fluorescent material (8) into the formed recesses (6); and
  mounting the first fluorescent material (4) onto a radiation source (2).

19. A method for manufacturing a light emitting system (1) comprising:
  providing a first fluorescent material (4);
  forming a foil with a binder material with a second fluorescent material (8); and
  depositing the foil with the second fluorescent material (8) onto the radiation source (2) with said first fluorescent material (4).

20. The method of claim 19, further comprising dispersing a powder phosphor ($d_{50\%}$=5 µm) of 1 to 20 percent by weight into a highly viscoelastic polymer gel as a binding carrier material including thermoplastics, thermoset plastics, resins, binders, base polymers, monomers, composite materials, and silicone compounds and forming the foils through processes such as molding, casting, extrusion, pultrusion, machining, thermal forming and plastic welding.

* * * * *